United States Patent [19]

Ehrfeld et al.

[11] Patent Number: 4,784,935
[45] Date of Patent: Nov. 15, 1988

[54] METHOD OF PRODUCING A PASSIVE OPTICAL DEVICE INCLUDING AT LEAST ONE REFLECTION GRATING

[75] Inventors: Wolfgang Ehrfeld, Karlsruhe; Dietrich Münchmeyer, Stutensee, both of Fed. Rep. of Germany

[73] Assignee: Kernforschungszentrum Karlsruhe GmbH, Karlsruhe, Fed. Rep. of Germany

[21] Appl. No.: 32,638

[22] Filed: Apr. 1, 1987

[30] Foreign Application Priority Data

Apr. 4, 1986 [DE] Fed. Rep. of Germany ....... 3611246

[51] Int. Cl.$^4$ ................................................ G03C 5/00
[52] U.S. Cl. ..................................... 430/321; 430/967;
378/34; 350/96.19; 370/3
[58] Field of Search ............... 430/321, 324, 967, 311;
378/34; 350/96.19, 96.15; 370/3

[56] References Cited

U.S. PATENT DOCUMENTS 4,622,663  11/1986  Ishikawa et al. ...................... 370/3
4,739,501  4/1988  Fussganger ............................ 370/3
4,740,951  4/1988  Lizet et al. ............................. 370/3

FOREIGN PATENT DOCUMENTS 529966  6/1987  Fed. Rep. of Germany .

OTHER PUBLICATIONS

SPIE, vol. 503, *Application, Theory and Fabrication of Periodic Structures,* 1984, "Wavelength Division Multiplexing/Demultiplexing (WDM) . . . ", Laude et al.
Optical Society of America Optics Letters, Dec. 1981, vol. 6, No. 12, pp. 639–641, "Planar Rowland Spectrometer For Fiber-Optic Wavelength . . . ".
Kernforschungszentrum Karlsruhe Manual No. KfK 3995 of Nov. 1985, "Herstellung von Mikrostrukturen mit grossem Aspektverhaltnis . . . ", Becker et al.

*Primary Examiner*—José G. Dees
*Attorney, Agent, or Firm*—Spencer & Frank

[57] ABSTRACT

A method of producing a passive optical device having optical components including at least one reflection grating, at least one port for polychromatic light and a plurality of ports for monochromatic light. The method includes producing the optical components of the device utilizing X-ray depth lithography so that the grating lines of the reflection grating are parallel to the direction of X-ray radiation emitted as part of the X-ray depth lithography.

9 Claims, 6 Drawing Sheets

1

METHOD OF PRODUCING A PASSIVE OPTICAL DEVICE INCLUDING AT LEAST ONE REFLECTION GRATING

BACKGROUND OF THE INVENTION

The present invention relates to a method of producing a passive optical device including one or a plurality of reflection gratings, e.g. echelette gratings and at least one port for polychromatic light and a plurality of ports for monochromatic light.

Such a device employing a planar reflection grating is illustrated and described in an article by J. P. Laude and J. M. Lerner in *SPIE, Vol. 503, Application, Theory and Fabrication of Periodic Structures* (1984), entitled "Wavelength Division Multiplexing/Demultiplexing (WDM) Using Diffraction Gratings," at pages 22–28. FIG. 4a at page 24 of that publication shows a Stimax arrangement including a concave mirror for focusing. An array of light conductive fibers is positioned in front of a photolithographically produced slit in the center of a planar reflection grating (echelette grating). The diverging beam coming from one of the input fibers is reflected by the concave mirror in a parallel beam towards the reflection grating. The grating sends the light back angularly dispersed towards the mirror. The mirror then focuses the spectrally divided image of the input fiber onto the output fibers located in the center of the grating.

H. W. Yen et al in *Optics Letters.* Volume 6, No. 12, December 1981, pages 639–641, describe a planar Rowland spectrometer for fiber optic wavelength demultiplexing. FIG. 1 at page 639 of that publication is a schematic representation of a planar Rowland spectrometer composed of a planar waveguide covered on both sides and having two opposing curved frontal faces. Glass fibers are connected to one of the frontal faces. A flexible reflection grating is pressed onto the other frontal face.

Both of the above described components perform the function of a wavelength demultiplexer and wavelength multiplexer, respectively, in optical communications transmission systems.

The manufacture of such components is relatively complicated and expensive since the components, particularly the reflection gratings, must be produced in separate manufacturing processes and must then be aligned and mounted with great care.

SUMMARY OF INVENTION

It is an object of the present invention to provide a passive optical component of the type described above in which the manufacture of the components can take place in common process steps, eliminating the separate alignment phase.

The above and other objects are accomplished according to the invention by the provision of a method of producing a passive optical device having optical components including at least one reflection grating, at least one port for polychromatic light and a plurality of ports for monochromatic light, the method including producing the optical components of the device utilizing X-ray depth lithography so that the grating lines of the reflection grating are oriented parallel to the direction of X-ray radiation emitted as part of said X-ray depth lithography.

X-Ray depth lithography employs X-ray masks in which the cross sections of the optical components, such as reflection gratings, mirrors, cylindrical lenses, and photoconductors in the form of absorber structures, can be predetermined with extremely high accuracy with respect to their geometric configuration and mutual association and can be transferred to the product to be manufactured by means of X-ray radiation. During the common process steps following the X-ray irradiation, this precision remains in effect to such an extent that no further processing, particularly no alignment work, is required.

In addition to optical communications transmission systems, the components according to the present invention can be used in wavelength selective detectors for measuring purposes.

BRIEF DESCRIPTION OF THE DRAWINGS

Embodiments of the invention will be described below with reference to the accompanying drawing figures, wherein.

DESCRIPTION OF THE PREFERRED EMBODIMENTS

Figure 1:
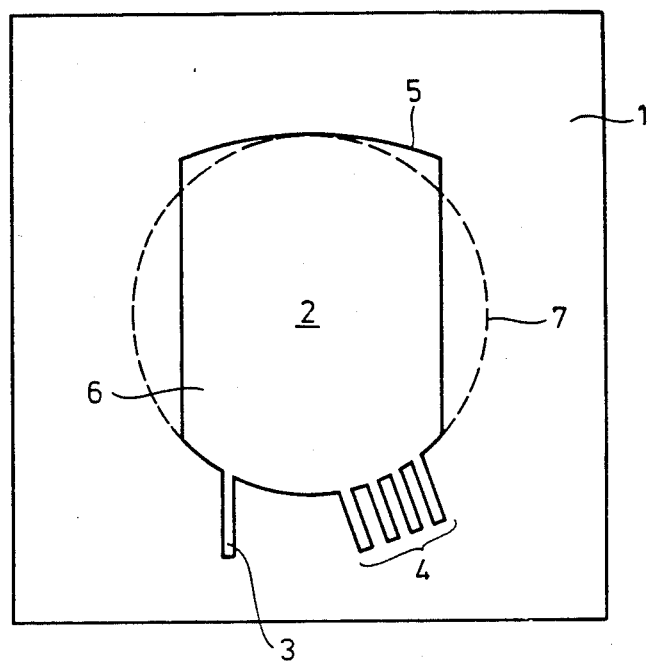
FIG. 1 is a plan view of an X-ray mask which can be employed according to the method of the invention.

FIG. 1 is a plan view of an X-ray mask 1 equipped with an absorber structure 2 comprised of a photoconductor port 3 for polychromatic light, photoconductor ports 4 for monochromatic light, a curved reflection grating 5 and a photoconductive body 6 which connects components 3 to 5. Components 3 to 5 are positioned according to a Rowland arrangement, i.e. photoconductor ports 3 and 4 end on a circle 7; and the radius of curvature of reflection grating 5 is twice the radius of circle 7 and is tangent to it. Absorber structure 2 is produced with the aid of electron beam lithography with extremely high precision as disclosed, for example, in German Pat. No. 3,529,966, corresponding to U.S. Pat. No. 4,698,285. Generally, such an X-ray mask is provided with a large number of such absorber structures arranged in parallel.

Figure 2:
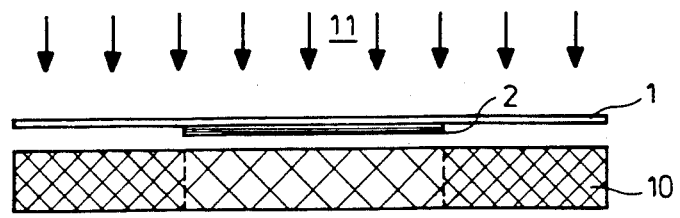
FIG. 2 is a cross sectional view of components utilized in the practice of the method according to the invention.
Figure 3:
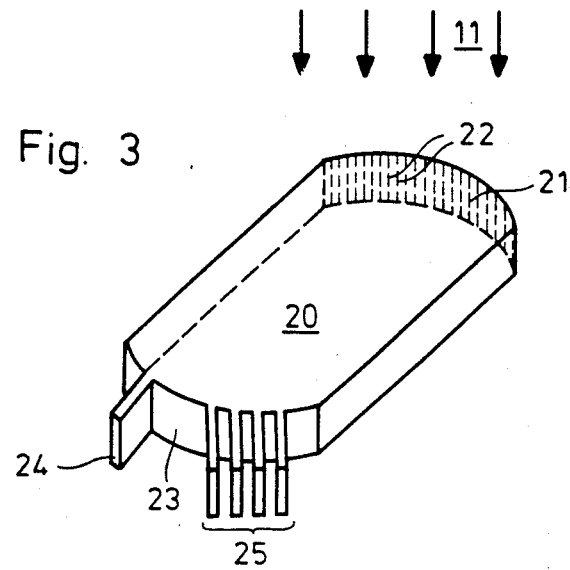
FIG. 3 is a perspective view of a plate-shaped transparent body containing an reflection grating and photoconductor ports as produced by the arrangement in FIG. 2.
Figure 4:
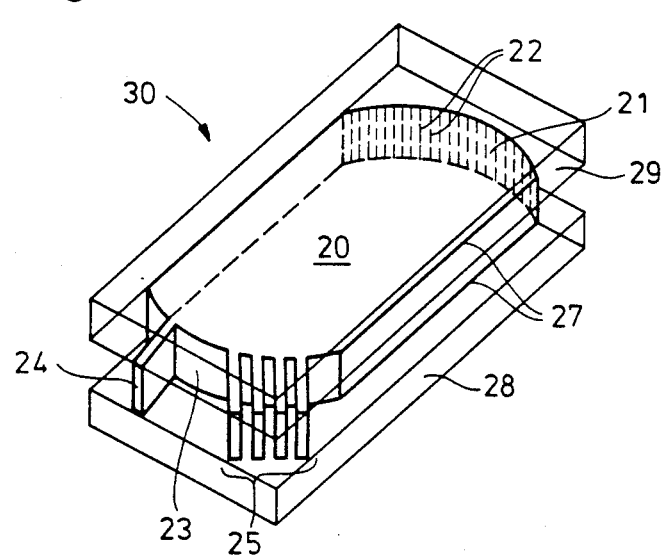
FIG. 4 is a perspective view which shows the finish mounted, passive optical device of FIG. 3 in a Rowland arrangement.

FIG. 2 is a cross-sectional view illustrating the transfer of absorber structure 2 in mask 1 into a layer 10 of polymethyl methacrylate PMMA by means of X-ray depth lithography employing synchrotron radiation 11, which according to the invention has to be oriented parallel to the grating lines to be produced, as described in detail and illustrated in KfK-Bericht [Report] 3995 by Kernforschungszentrum Karlsruhe (November 1985). After developing the PMMA, a plate-shaped, transparent body 20 results, as shown in a perspective view in FIG. 3, whose one frontal face is configured as a curved reflection grating 21 with its line of curvature extending in a plane perpendicular to X-ray radiation 11 and its grating lines 22 parallel to X-ray radiation 11. On the opposite frontal face 23, there is disposed a photoconductor port 24 for polychromatic light and a plurality of photoconductor ports 25 for monochromatic light. The reflection grating 21 is made reflective on the outside by a vapor-deposition of silver. As shown in FIG. 4, a body 20, including optical components 21 to 25, is glued by means of an epoxy resin adhesive 27 between two glass plates 28, 29, thus completing a passive optical device 30.

The precise dimensions and positions of the optical components must be selected according to the task for which the device is to be used. For use as a demultiplexer in an optical communications transmission system operating with wavelength multiplexing in a wavelength range of about 1.0 to 1.6 µm, it is of advantage, for example, for Rowland circle 7 to have a radius of about 5 mm with a spacing between grating lines 22 of reflection grating 21 of 2 to 3 µm and a thickness of PMMA layer 10 or, more precisely body 20, of 50 to 100 µm.

Figure 5:
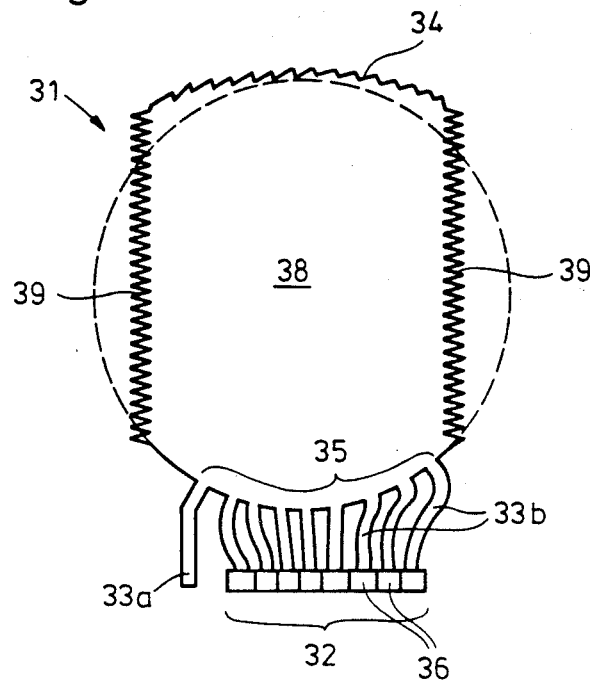
FIG. 5 is a plan view which shows a variation of the Rowland arrangement of FIG. 4 in which the optical components are likewise composed of a transparent plastic sensitive to X-rays.

FIG. 5 is a plan view of a corresponding passive optical device 31 for use as a compact optical spectrometer in conjunction with a planar diode array 32 as a wavelength selective sensor. The polychromatic light incident through a photoconductor 33a is divided by means of reflection grating 34 and travels via specially shaped photoconductors 33b which adapt the curved image field 35 to individual elements 36 of planar diode array 32. Photoconductive body 38 is limited at its lateral frontal faces by antireflective structures 39 produced simultaneously with reflection grating 34.

Figure 6:
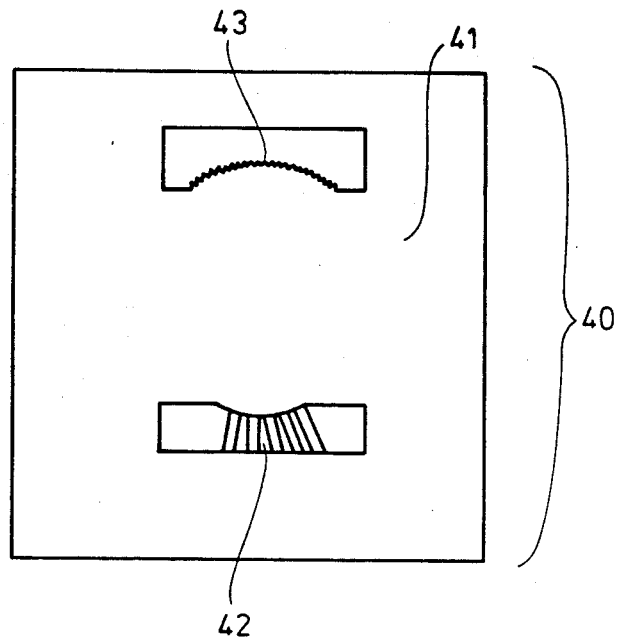
FIG. 6 is a plan view of another configuration of an X-ray mask for making an optical device according to the method of the invention.
Figure 7:
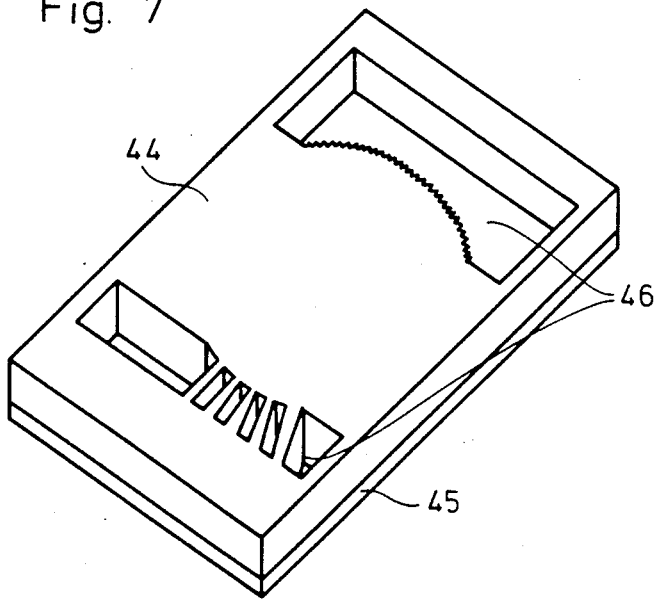
FIG. 7 is a perspective view which shows a PMMA mold used to manufacture an optical component of a device by way of X-ray depth lithography and galvanoplasty.
Figure 8:
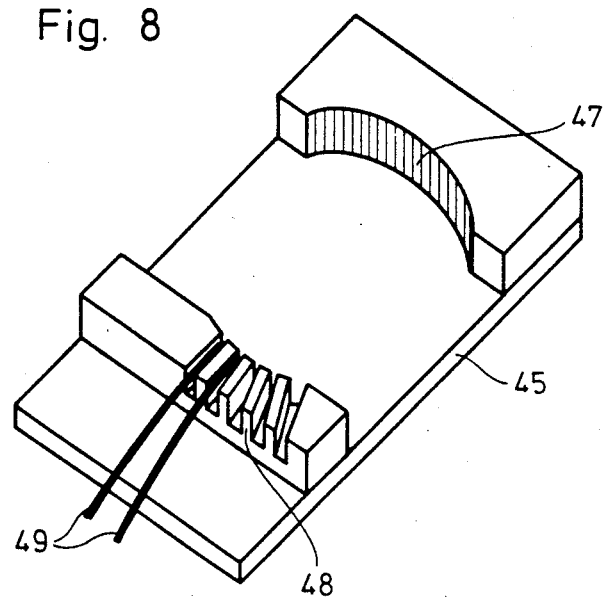
FIG. 8 is a perspective view showing metal components of a Rowland arrangement structured on a substrate, likewise including a curved reflection grating as in FIGS. 4 and 5.

FIGS. 6 to 8 show the production of a metal, passive optical device according to an X-ray depth lithography/galvanoplasty method i.e., a method using galvanoplastic forming.

FIG. 6 is a plan view of an X-ray mask 40 equipped with an absorber structure 41 to form a holding element 42 for photoconductor ports for polychromatic and monochromatic light and a curved reflection grating 43 in a Rowland arrangement. By means of X-ray depth lithography with synchrotron radiation, a PMMA mold 44 shown in FIG. 7 is produced on a metal substrate 45. Nickel is electrochemically deposited in the openings 46 of this mold. After dissolving out the PMMA, the metal, passive optical device shown in FIG. 8 results which is composed of a substrate 45, a curved metal reflection grating 47 and a holding element 48 for glass fibers 49 serving as photoconductor ports. Typical dimensions for the optical system are similar to those of the device of FIG. 4, except that the thickness of structures 47 and 48 is advisably selected to be several 100 µm.

Figure 9:
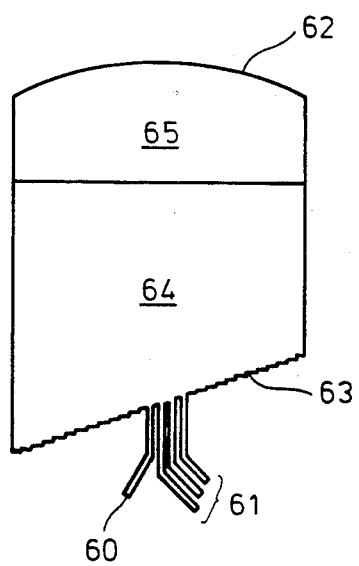
FIG. 9 is a plan view of a Stimax arrangement produced according to the method of the invention.
Figure 10:
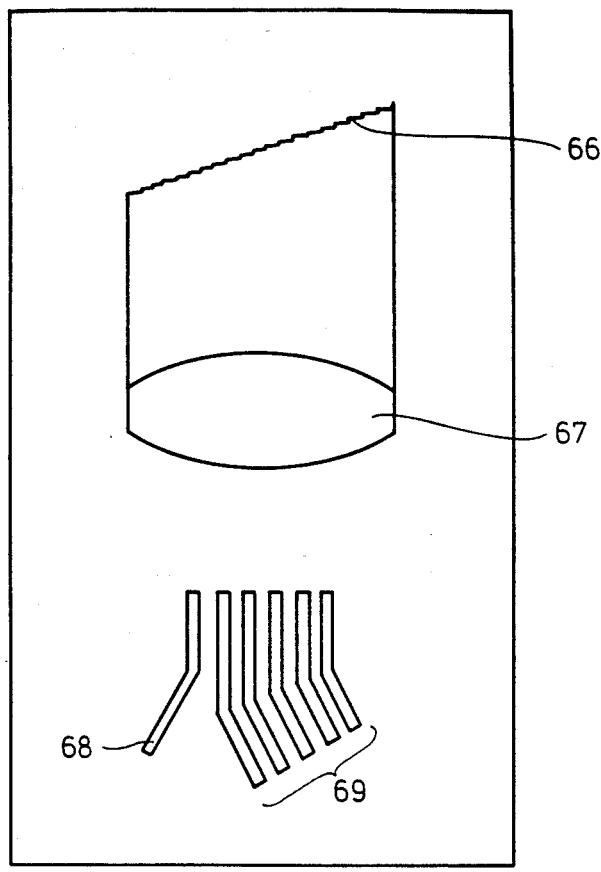
FIG. 10 is a plan view of an arrangement including a cylindrical lens produced by molding.
Figure 11:
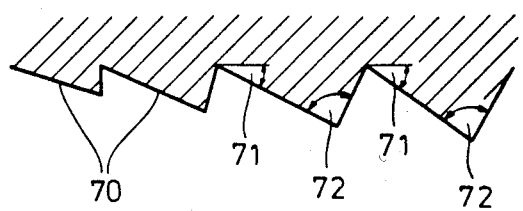
FIG. 11 is a schematic showing a reflection grating having variable step angles and grating lines.

FIGS. 9 to 11 are schematic plan views of examples of other arrangements of optical components for passive devices according to the invention.

FIG. 9 shows a Stimax arrangement with correction of spherical aberration by dividing the photoconductive region into two subregions 64 and 65 having different refraction indices.

The frontal face of subregion 64 includes a planar echelette grating 63 and ports 60, 61 for polychromatic and monochromatic light in the center of the reflection grating. The frontal face of subregion 65 is configured as a concave mirror 62. Such devices are produced by molding employing two different transparent plastic substances. Master tools whose structures are the negatives of optical components 64, 65 are produced by X-ray depth lithography and galvanoplasty i.e., galvanoplastic forming and are used as molds for plastics suitable for optical purposes.

FIG. 10 shows a similar arrangement employing a planar reflection grating 66, a cylindrical lens 67 and ports 68, 69 for polychromatic and monochromatic light, respectively. In this case as well, the component including reflection grating 66 and cylindrical lens 67 is composed of transparent plastics having different refraction indices and molded from master tools. Cylindrical lens 67 is disposed between ports 68, 69 and reflection grating 66, with the surfaces of the cylindrical lens being curved, with respect to the direction of the X-ray radiation for the production of the master tool, in a plane perpendicular to the X-ray radiation.

FIG. 11 shows that, in addition to the illustrated arrangements according to the invention employing planar or cylindrically curved reflection gratings having strictly periodic grating lines arrangements can easily be realized in which higher order optical errors can be corrected by means of any desired curvatures in the reflection grating having grating lines 70 extending parallel to the X-ray radiation, by deviating from the strict periodicity of grating lines 70 and by freely varying the step angles 71, 72; and special requirements can be met, for example with respect to planeness of the image field. Such an embodiment of the reflection grating can also be produced together with the other optical components, such as the photoconductor ports.

It will be understood that the above description of the present invention is susceptible to various modifications, changes and adaptations, and the same are intended to be comprehended within the meaning and range of equivalents of the appended claims. This holds in particular for other types of gratings, e.g. phase gratings.

What is claimed is:

1. Method of producing a passive optical device having optical components including at least one reflection grating, at least one port for polychromatic light and a plurality of ports for monochromatic light, comprising:
    producing the optical components of said device utilizing X-ray depth lithography so that the grating lines of the reflection grating are parallel to the direction of X-ray radiation emitted as part of said X-ray depth lithography.

2. Method as defined in claim 1, wherein said producing step includes producing a device composed of a plate-shaped, transparent body having one frontal face with a reflection grating made reflective on its exterior and having another frontal face provided with said ports.

3. Method as defined in claim 1, wherein said producing step includes producing a device in which the reflection grating has a curved cross section in a plane perpendicular to the direction of X-ray radiation.

4. Method as defined in claim 1, wherein said producing step includes producing a device including at least one cylindrical lens disposed between the reflection grating and the ports having a surface curved in a plane perpendicular to the direction of X-ray radiation, and said producing step further includes producing, by X-ray lithography, the cylindrical lens together with the reflection grating.

5. Method as defined in claim 1, wherein said device includes a body and said producing step includes producing, by X-ray lithography, at least some of said ports in the form of photoconductors together with said body.

6. Method as defined in claim 1, wherein said optical components are produced directly by X-ray depth lithography.

7. Method as defined in claim 1, wherein said producing step includes molding said optical components utilizing X-ray lithography to produce a mold for said optical components.

8. Method according to claim 7, wherein said producing step further includes utilizing galvanoplastic forming to produce said optical components from said mold.

9. Method according to claim 1, wherein said producing step includes molding said optical components utilizing X-ray lithography and galvanoplastic forming to produce a mold for said optical components.

* * * * *